(12) United States Patent
Santolucito (10) Patent No.: US 11,073,156 B2
(45) Date of Patent: *Jul. 27, 2021

(54) CEILING FAN SYSTEM AND ELECTRONICS HOUSING

(71) Applicant: HUNTER FAN COMPANY, Memphis, TN (US)

(72) Inventor: Phillip Santolucito, Memphis, TN (US)

(73) Assignee: Hunter Fan Company, Memphis, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/780,398

(22) Filed: Feb. 3, 2020

(65) Prior Publication Data

US 2020/0173448 A1 Jun. 4, 2020

Related U.S. Application Data

(63) Continuation of application No. 15/622,179, filed on Jun. 14, 2017, now Pat. No. 10,590,940.

(60) Provisional application No. 62/350,324, filed on Jun. 15, 2016.

(51) Int. Cl.
*H05K 7/20* (2006.01)
*F04D 29/58* (2006.01)
*F04D 25/08* (2006.01)
*F04D 25/06* (2006.01)

(52) U.S. Cl.
CPC ......... *F04D 25/088* (2013.01); *F04D 25/068* (2013.01); *H05K 7/20163* (2013.01); *H05K 7/20918* (2013.01); *F04D 29/5813* (2013.01)

(58) Field of Classification Search
CPC .... H05K 7/20154; H05K 7/202; H05K 7/206; H05K 7/20609; H05K 7/20754; H05K 7/20918

See application file for complete search history.

(56) References Cited

U.S. PATENT DOCUMENTS 3,149,666 A     9/1964 Coe
3,258,649 A *   6/1966 Arguin et al. ....... H05K 7/1461
                                                361/807
3,305,704 A     2/1967 Battista
(Continued)

FOREIGN PATENT DOCUMENTS

CN      101202529 A    6/2008
CN      102668546 A    9/2012
(Continued)

OTHER PUBLICATIONS

European Patent Office, Supplementary European Search Report re Application No. 17813986.1-1203 / 3472524 PCT/2017037367, dated Jan. 14, 2020, 10 pages, Munich, Germany.

(Continued)

*Primary Examiner* — Robert J Hoffberg
(74) *Attorney, Agent, or Firm* — McGarry Bair PC (57) ABSTRACT

A system and apparatus for a ceiling fan electronics assembly including a housing with an interior for housing an electrical system for the ceiling fan. The electrical system can provide a supply of power to the ceiling fan as well as interpret electrical instruction signals for controlling the operation of the ceiling fan. The housing can include a partition separating the interior into a vent section and an electronics section.

20 Claims, 7 Drawing Sheets

(56) References Cited

U.S. PATENT DOCUMENTS

| | | | |
|---|---|---|---|
| 5,235,491 A | 8/1993 | Weiss | |
| 5,424,915 A | 6/1995 | Katooka et al. | |
| 5,742,478 A * | 4/1998 | Wu .................... | H05K 7/20154 |
| | | | 361/704 |
| 6,046,908 A * | 4/2000 | Feng .................. | H05K 7/20154 |
| | | | 361/690 |
| 6,328,529 B1 | 12/2001 | Yamaguchi et al. | |
| 7,265,981 B2 | 9/2007 | Lee | |
| 7,312,992 B2 | 12/2007 | Jory et al. | |
| 7,413,463 B2 * | 8/2008 | Matsuo ................ | H05K 5/0039 |
| | | | 439/377 |
| 7,436,660 B2 | 10/2008 | Pedoeem et al. | |
| 7,729,115 B2 | 6/2010 | Hall et al. | |
| 7,816,631 B2 | 10/2010 | Cramer | |
| 7,898,806 B2 | 3/2011 | Isomoto | |
| 7,957,143 B2 | 6/2011 | Isomoto | |
| 8,363,408 B2 | 1/2013 | Zheng | |
| 8,611,088 B2 | 12/2013 | Barna | |
| 8,873,243 B2 * | 10/2014 | Sano .................... | H05K 5/0039 |
| | | | 361/756 |
| 8,885,343 B2 * | 11/2014 | Lischeck ............ | H05K 7/20854 |
| | | | 361/715 |
| 9,258,924 B2 | 2/2016 | Wu et al. | |
| 9,493,126 B2 * | 11/2016 | Yang ...................... | H05K 5/006 |
| 9,510,438 B2 | 11/2016 | Wakana et al. | |
| 9,510,466 B2 * | 11/2016 | Yang .................... | H05K 5/0039 |
| 9,653,375 B2 * | 5/2017 | Kawaguchi ........ | H05K 7/20918 |
| 9,795,067 B2 | 10/2017 | Takezawa et al. | |
| 9,863,428 B2 | 1/2018 | Tsujimoto et al. | |
| 9,867,313 B2 | 1/2018 | Kuwahara | |
| 9,877,418 B2 | 1/2018 | Naito et al. | |
| 10,111,360 B2 | 10/2018 | Perrin et al. | |
| 10,238,004 B2 | 3/2019 | Baran et al. | |
| 10,306,813 B2 | 5/2019 | Kobayashi et al. | |
| 2006/0114652 A1 | 6/2006 | Jory et al. | |
| 2006/0171115 A1 | 8/2006 | Cramer | |
| 2008/0112135 A1 | 5/2008 | Kleinecke et al. | |
| 2012/0236499 A1 | 9/2012 | Murayama et al. | |
| 2012/0250254 A1 * | 10/2012 | Kojyo ................ | H05K 7/20918 |
| | | | 361/692 |
| 2015/0049436 A1 | 2/2015 | Wu et al. | |
| 2015/0062811 A1 | 3/2015 | Suzuki et al. | |
| 2018/0132382 A1 | 5/2018 | Baran et al. | |
| 2019/0373749 A1 * | 12/2019 | Chao .................... | H05K 5/064 |

FOREIGN PATENT DOCUMENTS

| | | | | |
|---|---|---|---|---|
| CN | 202524703 U | | 11/2012 | |
| CN | 203445107 U | | 2/2014 | |
| CN | 104756619 A | | 7/2015 | |
| DE | 202004009926 U1 | | 9/2004 | |
| EP | 1870934 A1 * | | 12/2007 | ......... H05K 7/20918 |
| EP | 2916636 A1 | | 9/2015 | |
| EP | 2879476 B1 | | 6/2016 | |
| EP | 3468025 A1 | | 4/2019 | |
| JP | 2002057481 A | | 2/2002 | |
| JP | 2009277742 A | | 11/2009 | |
| JP | 2013038355 A | | 2/2013 | |
| JP | 2013038355 A * | | 2/2013 | |
| KR | 200172854 Y1 * | | 3/2000 | |
| WO | 0199483 A1 | | 12/2001 | |
| WO | 2009068092 A1 | | 6/2009 | |

OTHER PUBLICATIONS

Chinese Patent Office, Office Action re Corresponding Application No. 201780037581.8, dated Apr. 7, 2020, 10 pages, China.

* cited by examiner

CEILING FAN SYSTEM AND ELECTRONICS HOUSING

CROSS-REFERENCE TO RELATED APPLICATION(S)

This application claims priority to and is a continuation application of U.S. patent application Ser. No. 15/622,179, filed Jun. 14, 2017, now issued as U.S. Pat. No. 10,590,940, which claims priority to U.S. Provisional Patent Application No. 62/350,324 filed Jun. 15, 2016, the both of which are incorporated herein by reference in their entirety.

BACKGROUND OF THE INVENTION

Ceiling fans are used to generate airflow within a space or area, often used for cooling or temperature regulation. Ceiling fans can be used in industrial, commercial, residential, or rural environments to circulate air to maintain proper temperature regulation.

In industrial applications, such as manufacturing or warehouse uses, high volume low speed (HVLS) ceiling fans can be used to circulate a large quantity of air to provide temperature regulation to a large area or workspace. A HVLS fan can be a fan having a diameter greater than 7 feet, which moves a high volume of air at a low rotational speed. The HVLS fans are driven slowly with a wide span to distribute large amount of air at a low rotational speed.

Controllers are required for controlled operating the ceiling fans, or for adapting an electric current to the particular needs of the ceiling fan. Typically, such a controller is incorporated within the ceiling fan, such as mounted to or encased within a motor housing.

BRIEF DESCRIPTION OF THE INVENTION

In one aspect, the disclosure relates to an electronics housing defining an interior, the electronics housing comprising: at least one open end; a cover, removably enclosing the interior at the at least one open end; a slot provided along the interior; a partition, slidable along the slot to effectively separate the interior into a first section and a second section, the partition including an opening and mounted to the cover, with the opening configured to carry an electrical component on the partition; and wherein the partition is mountable within the interior by securing the cover to the at least one open end.

In another aspect, the disclosure relates to an electronics assembly comprising: a housing, defining an interior, and including an open end and a pair of opposing slots; a first cover enclosing the interior at the open end; a partition, including an opening, mounted to the first cover, and slidably positioned within the interior along the pair of opposing slots when the first cover encloses the interior, with the partition partially separating the interior into a first section and a second section; and wherein the opening in the partition is configured to receive an electronics component to fully separate the first section and the second section.

In yet another aspect, the disclosure relates to an electronics housing assembly defining an interior, the electronics housing assembly comprising: a first open end; a cover closing the interior at the first open end with the cover including a set of vent openings and a set of electronics receptacles; and a partition mounted to the cover and including an opening and a slot, with the partition slidably mounted in the interior along the slot when the cover closes the interior at the first open end, effectively separating the interior into a first section and a second section.

DETAILED DESCRIPTION OF THE INVENTION

The described embodiments of the present invention are directed to a housing for a ceiling fan system. For purposes of illustration, the present invention will be described with respect to an industrial ceiling fan in an industrial environment. It will be understood, however, that the invention is not so limited and may have general applicability within any suitable ceiling fan, including residential, rural, business or any other setting where a ceiling fan is appropriate or desirable.

Figure 1:
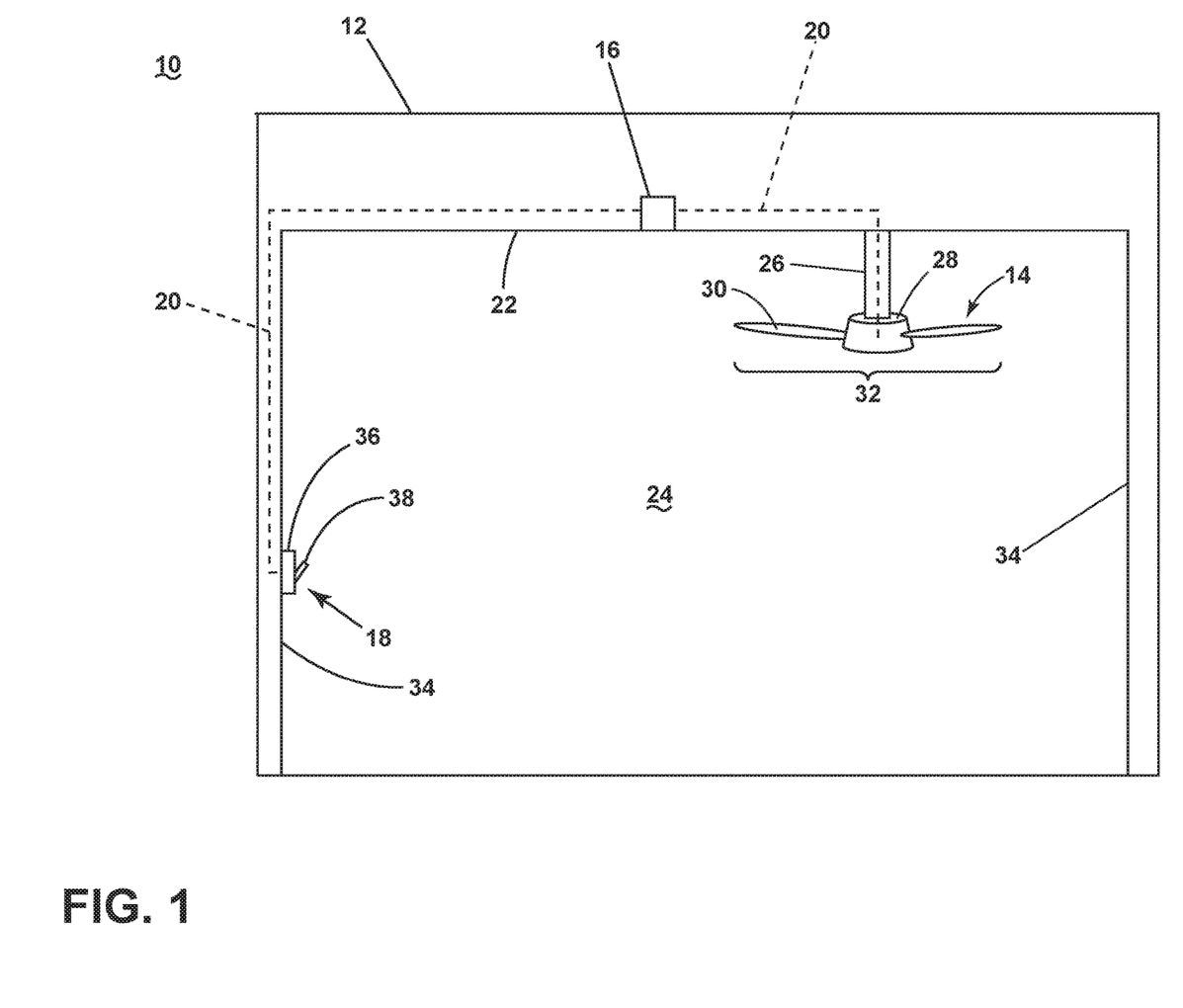
FIG. 1 is a schematic view illustrating a ceiling fan system installed within a structure including a ceiling fan electronics assembly.

FIG. 1 illustrates a ceiling fan system 10 installed within a structure 12. The structure 12, for example, can be a warehouse or manufacturing plant where use of an industrial ceiling fan is advantageous. It is contemplated that the structure 12 can be any structure where the installation and use of a ceiling fan would be desirable or advantageous.

The ceiling fan system 10 includes a ceiling fan 14, a ceiling fan electronics assembly 16, and a wall controller 18. The electronics assembly 16 can provide an electrical supply to the ceiling fan 14 as well as control signals for operating the ceiling fan 14. Conduits 20, such as electrical wiring within the structure 12, can communicatively couple the ceiling fan 14, electronics assembly 16 and wall controller 18.

The ceiling fan 14 can suspend from the structure 12, extending from a ceiling 22 into a structure interior 24 defined within the structure 12. The ceiling fan 14 can include a downrod 26, a motor housing 28 including a motor assembly (not shown), and one or more blades 30 driven by the motor assembly. The motor assembly can include a rotor and a stator. The stator drives the rotor for inducing rotation of blades 30 coupled to the rotor. The blades 30 can define a span 32 as the radial expanse of the blades 30. The downrod 26 can suspend the ceiling fan 14 from the ceiling 22, positioning the ceiling fan 14 within the area 24. The motor housing 28 can couple to the downrod 26. The blades 30 can mount to and extend radially from the motor housing 28. A rotor (not shown) can be disposed within the ceiling fan 14. The blades 30 can couple to the rotor for rotating the blades about the motor housing 28 to drive a volume of air within the structure interior 24.

The electronics assembly 16 can be disposed outside of the span 32 of the blades 30 and above the ceiling 22 such that the electronics assembly 16 is not disposed within the structure interior 24. Alternatively, the structure 12 can be organized such that the electronics assembly 16 is disposed within the structure interior 24, but above the extent of the downrod 26 and outside of the span 32 of the blades 30. Such an example can include a building containing rafters or ceiling beams. The ceiling fan 14 can be suspended from the rafters or beams, while the electronics assembly 16 is disposed above the rafters, outside of the span 32 of the blades 30.

The electronics assembly 16 can receive a supply of power from the structure 12. The supply of power can be particularly provided to the motor within the ceiling fan 14 to drive the blades 30 at a desired rotational speed. Similarly, as the electronics assembly 16 can receive control signals from the wall controller 18 to particularly operate the ceiling fan 14. Such operations can include controlling rotational speed, rotational direction, or power consumption in non-limiting examples.

The wall controller 18 can mount to a wall 34 and include a housing 36 and a switch 38. The housing 36 can include electrical connections for interpreting and sending instructions from the switch 38 to the electronics assembly 16. The switch 38, can be a simple switch, having only on/off capabilities, or can be complex, including multiple functionalities to operate the ceiling fan 14. Such functionalities can include, speed control, airflow direction control, temperature regulation, power consumption, or similar functionalities in non-limiting examples.

Figure 2:
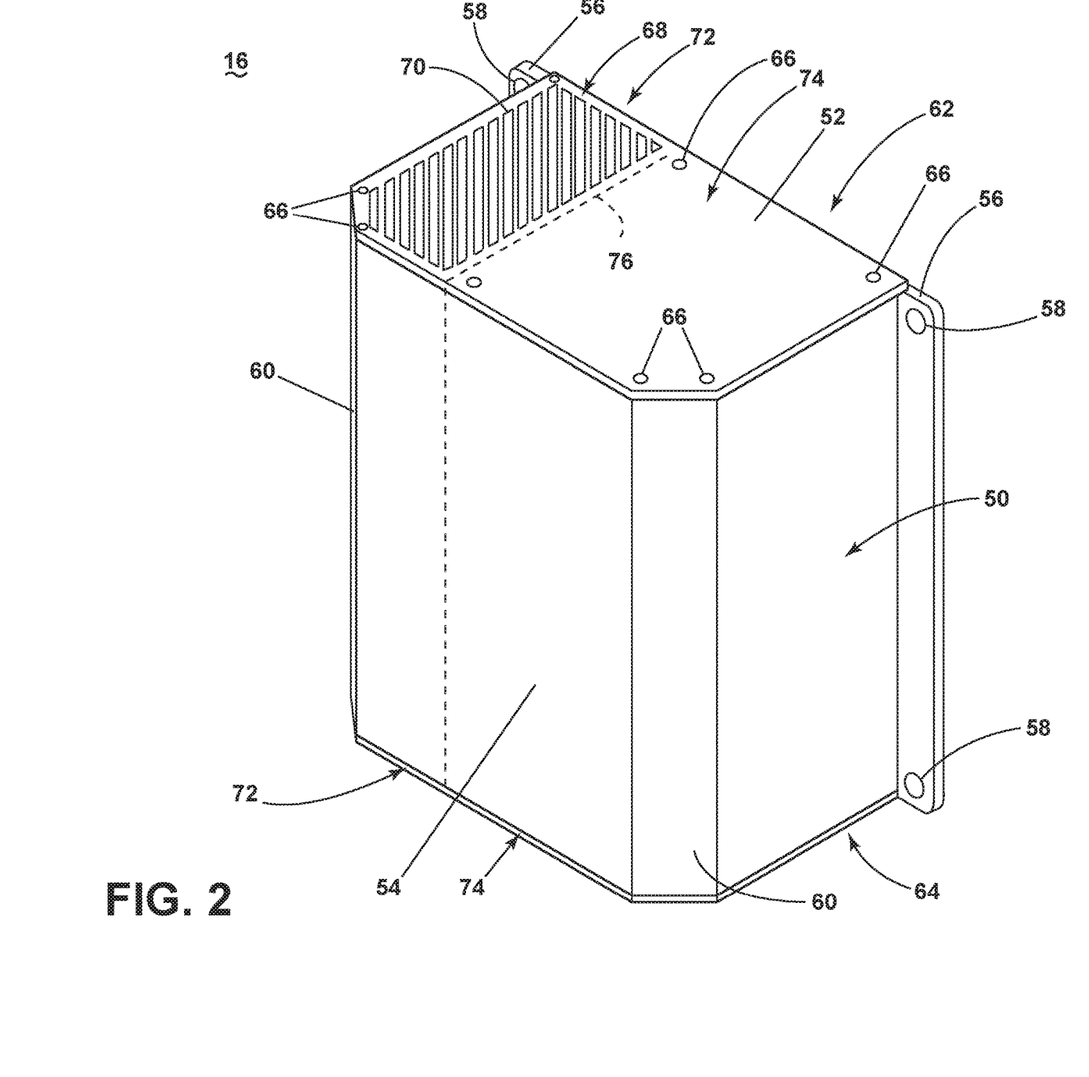
FIG. 2 is a perspective view of a housing of the ceiling fan electronics assembly of FIG. 1.

Referring to FIG. 2, the ceiling fan electronics assembly 16 includes a housing 50 and a cover 52. The housing 50 can further include a body 54 and opposing flanges 56. The flanges 56 can include one or more apertures 58. The apertures 58 can be used to mount the ceiling fan electronics assembly 16 to the structure 12. The body 54 can be substantially cubic, or linear, including truncated edges 60 opposite of the flanges 56.

The ceiling fan electronics assembly 16 can include a first end 62 and a second end 64. The cover 52 can mount to the first end 62. The cover 52 can have a plurality of fastener apertures 66. The fastener apertures 66 can receive a fastener such as a screw for mounting the cover 52 to the body 54. Additionally, the cover 52 can include a vent 68, having a plurality of arranged vent apertures 70. The vent 68 provides for fluid communication between the interior and exterior of the ceiling fan electronics assembly 16.

The ceiling fan electronics assembly 16 can be divided into a first section 72 and a second section 74 by a dividing line 76. The dividing line 76 can extend longitudinally through the electronics assembly 16. The vent 68 can be included on the first section 72, while the second section 74 is closed at the cover 52. The dividing line 76, in one example, can be located between the vent 68 and the fastener apertures 66 adjacent to the vent 68 on the cover 52. It should be understood, however, that the dimensions and organization as shown is exemplary. The first and second sections 72, 74 can be larger or smaller, having the dividing line 76 placed anywhere along the longitudinal length of the electronics assembly 16.

Figure 3:
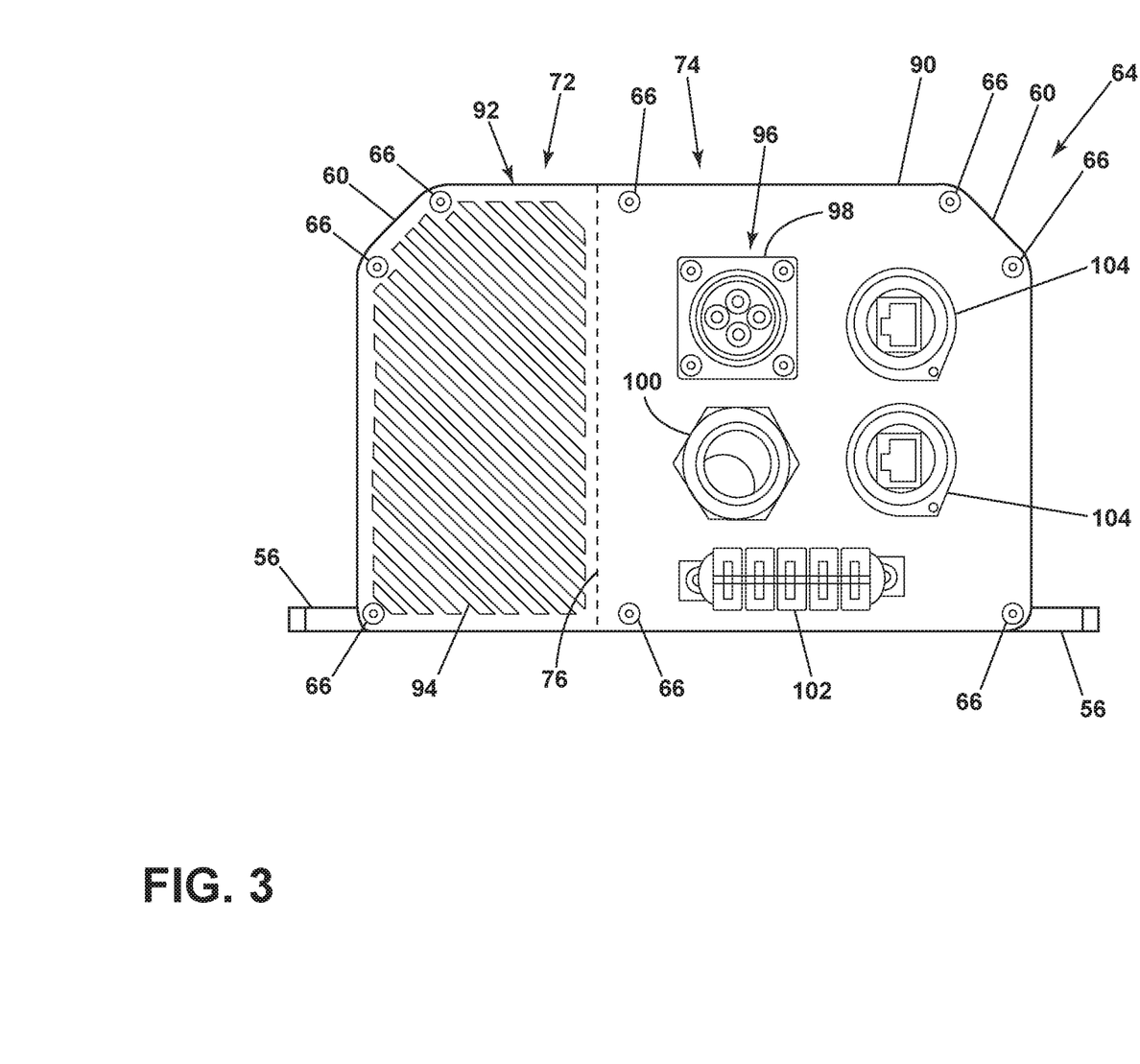
FIG. 3 is a bottom view of the housing of FIG. 2.

Referring now to FIG. 3 a bottom view of the ceiling fan electronics assembly 16 includes a bottom cover 90 disposed at the second end 64. The bottom cover 90 can be divided into the first section 72 and the second section 74 by the dividing line 76. Similar to the cover 52 at the first end 62, the bottom cover 90 includes a vent 92 having a plurality of vent openings 94. The vent 92 is located in the first section 72.

A plurality of electronics receptacles 96 are disposed in the remaining portion of the bottom cover 90, located in the second section 74. The electronics receptacles 96 can include a motor receptacle 98, a cable inlet 100, a terminal strip 102, and two signal cable inlets 104. The motor receptacle 98 can be a four-prong female receptacle for receiving a conduit for supplying electricity to the ceiling fan. The cable inlet 100, for example, can be a PG21 cable gland, for securing a cable line provided to the interior of the ceiling fan electronics assembly 16. The terminal strip 102 can receive a plurality of electrical wires, such as for providing a source of electricity from the structure to the ceiling fan electronics assembly 16. Finally, the signal cable inlet 104, for example, can be category-5 cable receptacles for providing a network signal to the ceiling fan electronics assembly 16. It should be appreciated that the electronic receptacles 96 as illustrated and described are exemplary. Any number or type of electronic receptacles 96 can be used, such that a source of electricity is provided to the ceiling fan electronics assembly 16, which can be provided to the ceiling fan 14 for operating the ceiling fan 14.

Figure 4:
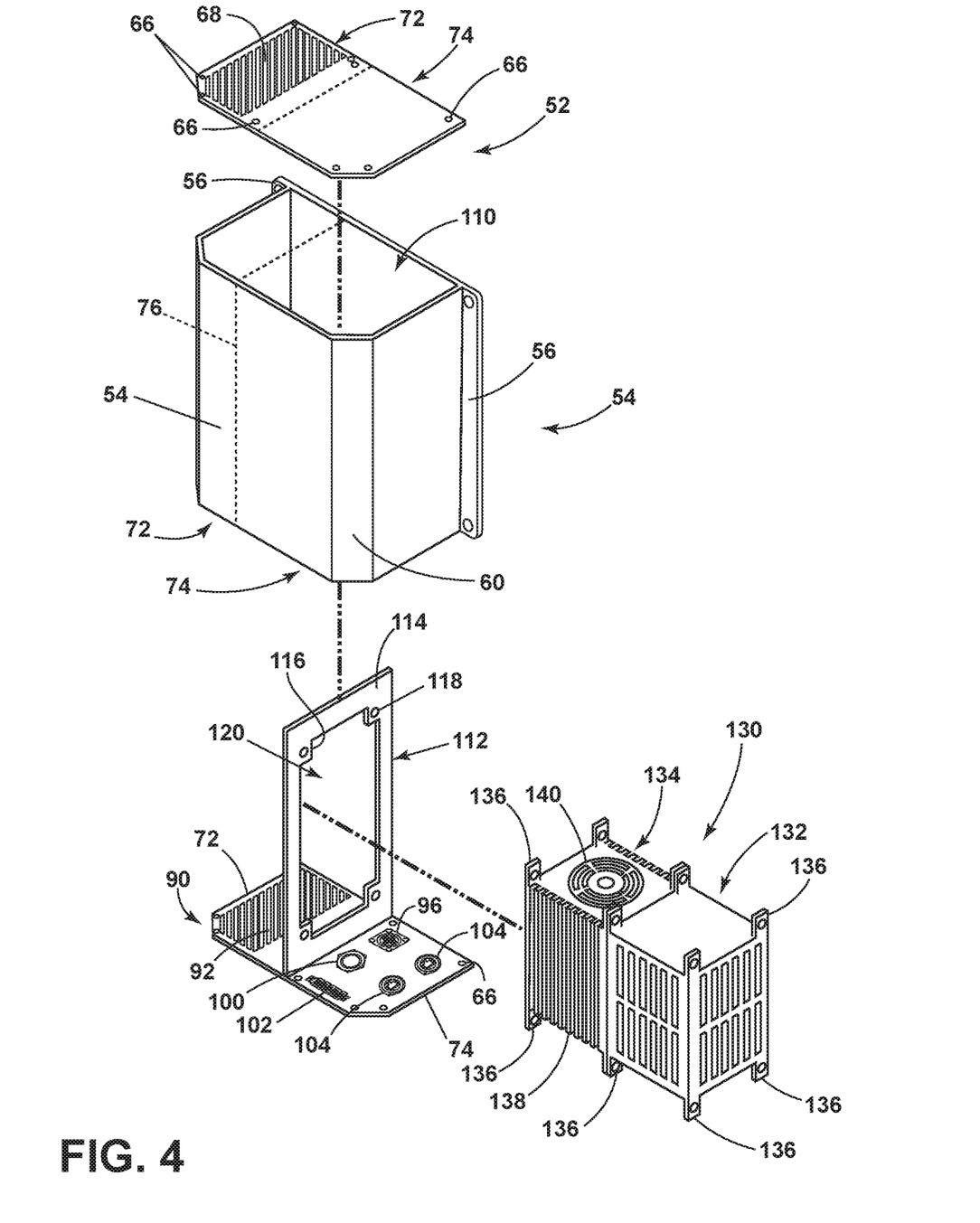
FIG. 4 is an exploded view of the ceiling fan electronics assembly of FIG. 1.

Referring now to FIG. 4, an exploded view of the ceiling fan electronics assembly 16. The housing 50 defines an interior 110. The interior 110 can also be divided into the first section 72 and the second section 74.

A partition 112 can couple to or be integral with the bottom cover 90. The partition 112 extends orthogonal from the bottom cover 90. The partition 112 can define the dividing line 76 for defining the first section 72 and the second section 74, such that the partition 112 can be transposed on the body 54 and the covers 52, 90 to provide the dividing line 76. The partition 112 includes a frame 114 having four corners 116. The partition 112 physically divides the first section 72 and the second section 74 within the interior 110. Additionally, it is contemplated that the partition 112 can thermally, fluidly, or otherwise separate the first and second section 72, 74. Mounting apertures 118 are disposed within the corners 116. An opening 120 is defined within the frame 114.

A power control module 130 can be disposed in the opening 120 within the interior 110. The power control module 130 can include an electronics portion 132 and a heat sink portion 134. A plurality of mounts 136 can protrude from the power control module 130 for mounting to the frame 114 and the housing 50. The power control module 130 can receive a supply of power from the structure or building in which the electronics assembly 16 resides. The power control module 130 can provide the supply of power to the ceiling fan 14 for operating the ceiling fan. The power control module 130 can particularly supply the power to the ceiling fan 14 to particularly operate the motor. For example, the power supplied to the ceiling fan can be used to determine the rotational speed of the blades, the rotational direction of the blades, or the efficiency of the ceiling fan 14 in non-limiting examples. Furthermore, the power control module 130 can receive a plurality of electrical signals, wired or wirelessly, to determine operation of the ceiling fan 14. For example, such electrical signals can include control signals to determine the power supplied to the ceiling fan 14 to control aspects of the ceiling fan 14 such as the rotational speed, direction, or efficiency. An additional example of such a control signal can include an on/off signal to control when the ceiling fan 14 is operational.

The electronics portion 132 can include electronic hardware for receiving an electrical current and providing the electrical current to the ceiling fan 14. Additionally, the electronics portion 132 can receive an information signal for determining the application of the electrical current to the ceiling fan. For example, the information signal received by the electronics portion can be indicative of a current temperature, where such a signal can be interpreted to send an electrical current to the ceiling fan to operate the ceiling fan based upon the measured temperature. It should be appreciated that the electrical portion 132 can receive a power supply for providing the supply of power to the ceiling fan 14 as well as information for controlling such a power supply to the ceiling fan 14. Such sending and receiving of power and electrical signals can be sent and received via the receptacles 96 coupled to the electronics portion 132. The electrical portion 132 can include a processor and memory, for interpreting such electrical signals and operating the electronics assembly 16 based upon software stored on the memory and executed by the processor.

The heat sink portion 134 can include a heat sink 138 and a fan 140. The miniature fan 140 can be operably coupled to the electronics portion 132 for controlling the miniature fan 140. Alternatively, it is contemplated that the miniature fan 140 is mounted at one of the vents 68, 92. The heat sink portion 134 can be used to draw heat away from the electronics portions 132 through thermal transfer. The heat passed to the heat sink 138 can be moved from the heat sink 138 by the miniature fan 140 by drawing or providing a volume of air through the heat sink 138.

Figure 5:
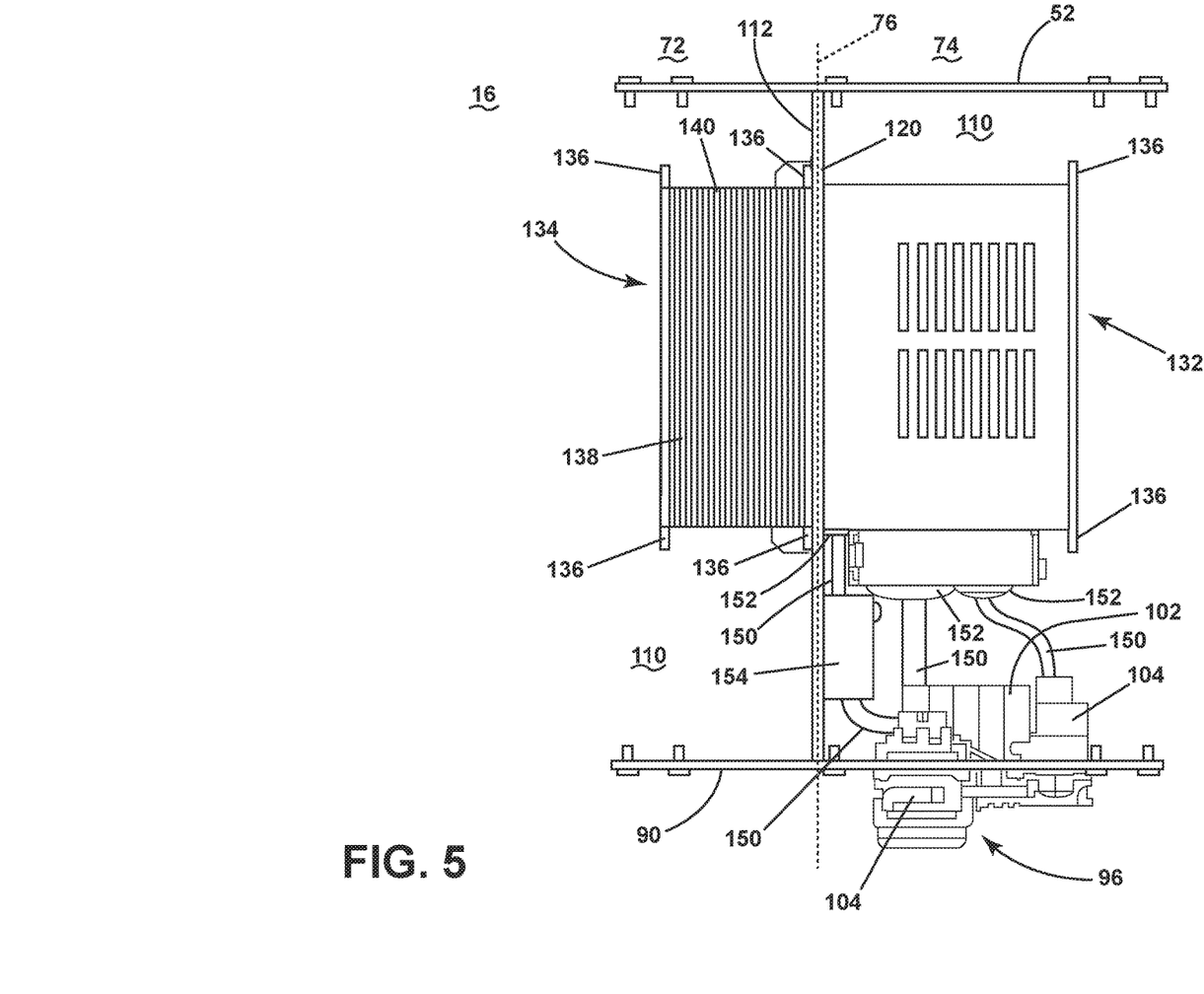
FIG. 5 is a view of the ceiling fan electronics assembly of FIG. 1 having the housing removed.

Referring now to FIG. 5, a side view of the interior 110 of the ceiling fan electronics assembly 16 is illustrated having the housing 50 removed with the power control module 130 installed within the opening 120 of the partition 112. The power control module 130 can further include a plurality of conduits 150 and receptacles 152 for coupling the receptacles of the bottom cover 90 to the power control module 130. A relay 154 can couple from the terminal strip 102 to the power control module 130 to provide signals from the terminal strip 102 to the power control module 130.

The partition 112 can define the dividing line 76 for defining the first section 72 and the second section 74. The partition 112 can operate to separate the electronics portion 132 of the power control module 130 from the heat sink portion 134 by organizing the portions 132, 134 into the separate sections 72, 74. Thus, it should be appreciated that the first section 72 can be a vent section including the heat sink 138, the miniature fan 140 and the vents 68, 92. The second section 74 can be an electronics section, including the electronics portion 132 of the power control module 130 and the receptacles 96, 152, conduits 150, and the relay 154. The electronics section can have an increased operational temperature, which is removed through thermal transfer to the vent section at the heat sink 138.

Figure 6:
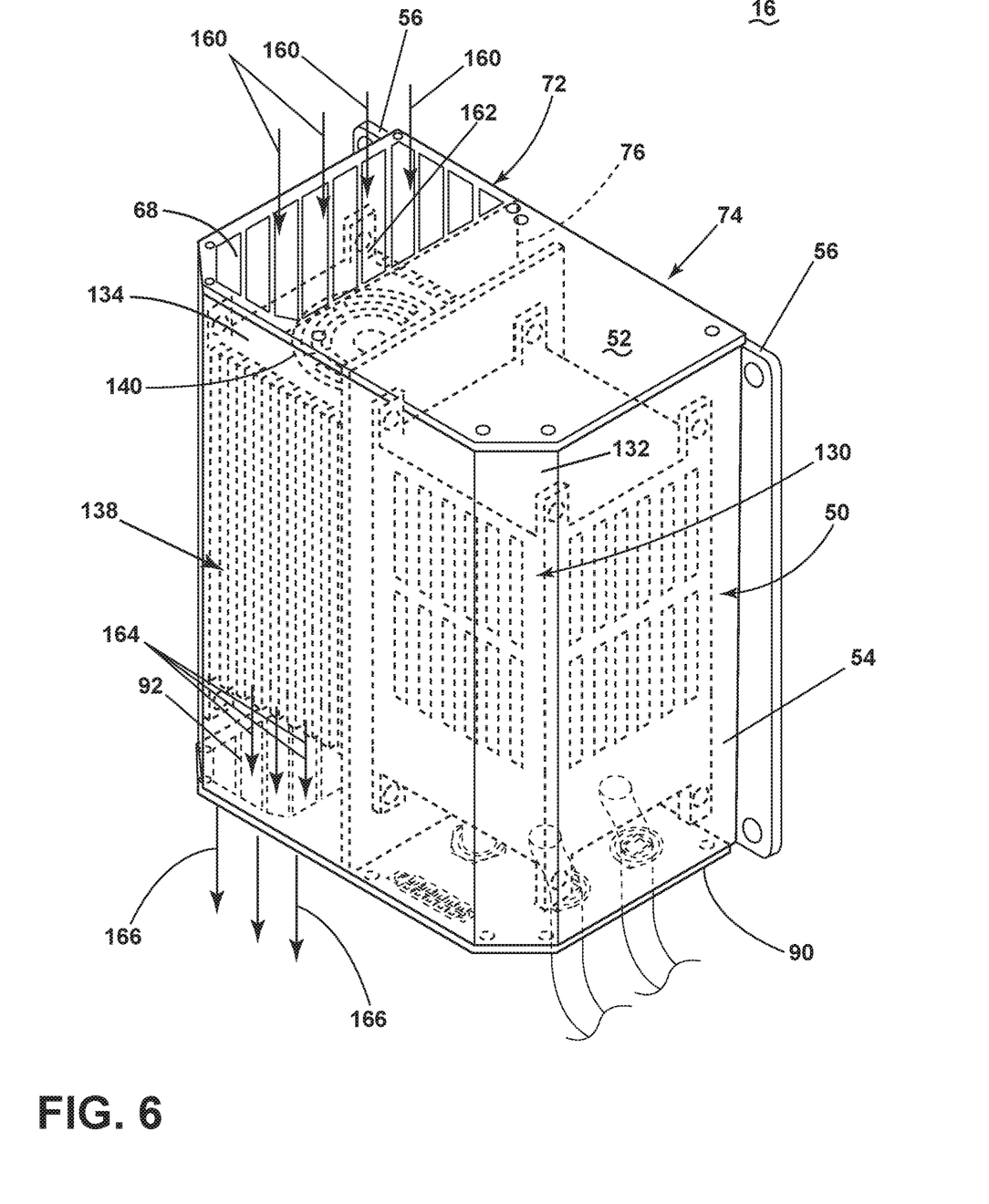
FIG. 6 is a perspective view of the ceiling fan electronics assembly of FIG. 2 illustrating a flow path through a vent section of the ceiling fan electronics assembly.

Referring now to FIG. 6, a flow of external air 160 can be drawn into the interior 110 through the vent 68 on the cover 52. From the vent 68 the air can be drawn through the miniature fan 140 and moved through the heat sink 138. During operation of the power control module 130, the heat sink 138 draws heat from the electronics portion 132 through thermal heat transfer. The miniature fan 140 draws a volume of air 160 from the vent 68 into the heat sink 138 to draw away the heat from the heat sink 138. As such, the power control module 130 can be cooled, while remaining separate from the airflow 160 passing through the heat sink 138.

From the heat sink 138, a heated airflow 164 is provided to the vent 92 on the bottom cover 90. The heated airflow 164 is moved through the vent 92 as an exhausted flow 166 which is released to the environment.

It should be appreciated that the dual-chamber system of the ceiling fan electronics assembly 16 provides for protecting the power control module 130 from damage or external conditions by housing the electronics portion within the second section 74, while providing for efficient heat removal through the first section 72 and the heat sink 138. The ceiling fan electronics assembly 16 can be disposed outside of the span of the fan blades 30, providing for servicing of the ceiling fan electronics assembly 16 while maintaining operation of the ceiling fan.

The combination of the vents 68, 92, the miniature fan 140, and the heat sink 138 provides for the flow path 160, 164, 166 for effectively removing heat from the power control module 130 to maintain operating within proper temperature thresholds.

Figure 7:
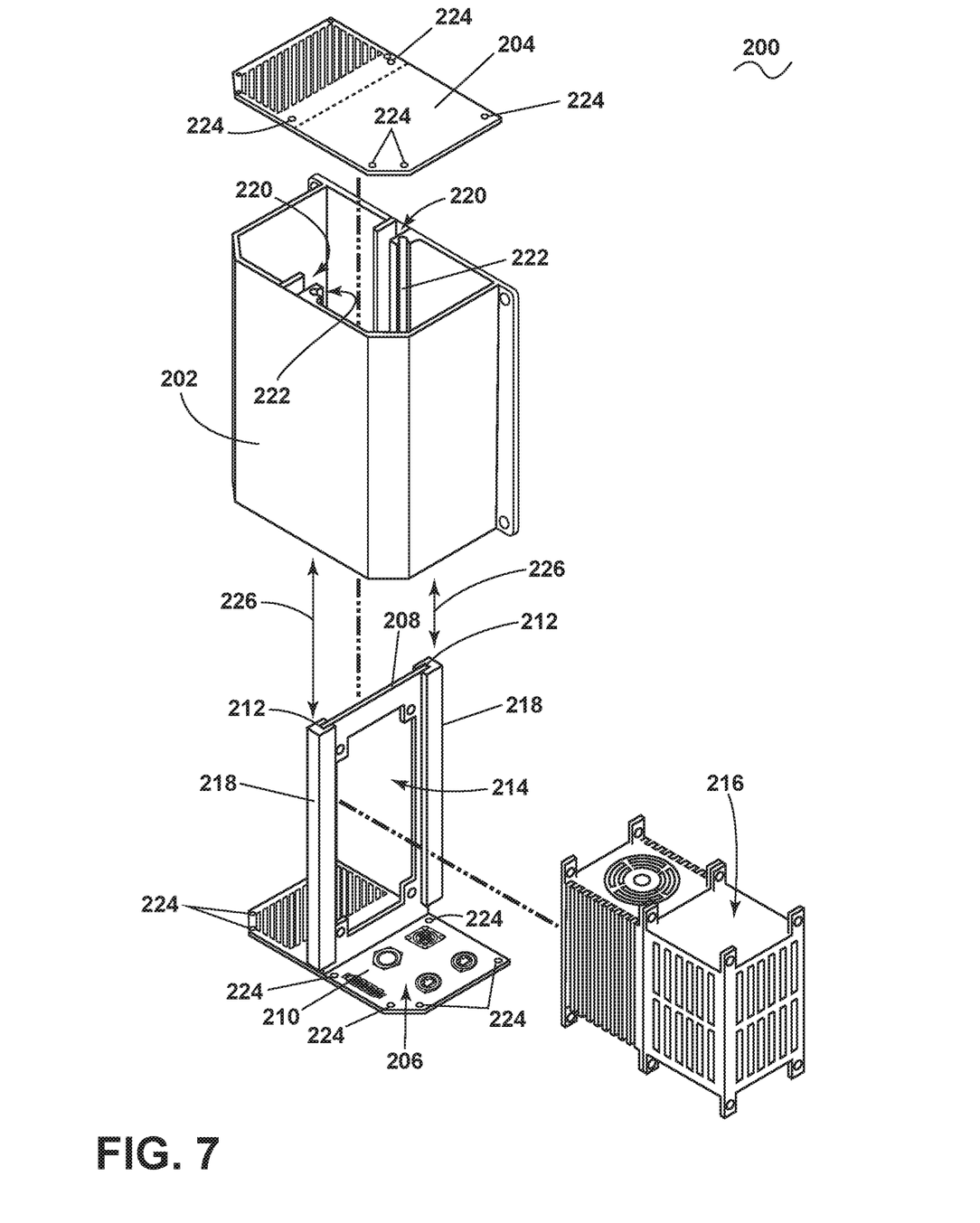
FIG. 7 is an exploded view of an alternative housing for a ceiling fan electronics assembly.

Referring now to FIG. 7, an alternative ceiling fan drive assembly 200 includes a body 202, a cover plate 204, and a base plate 206. A partition 208 couples to a first surface 210 of the base plate 206, and has opposing sidewalls 212. The partition 208 can include a central opening 214 adapted to receive a power control module 216. A trim element 218 can be provided on each of the sidewalls 212. The trim element 218 can be made of slightly deformable material or a material generating minimal friction to facilitate sliding movement of the trim element 218 along the body 202 alternatively, the trim element 218 can be lubricated to minimize friction along the trim element 218.

The body 202 can include two opposing slots 220. The slots 220 can be adapted to slidably receive the trim element 218 and the sidewalls 212 of the partition 208 to align the partition 208 and the base plate 206 to the body 202. A set of rails 222 can be provided in the body 202 adjacent the slots 220. The rails 222 can be adapted to align to openings 224 in the cover plate 204 and the base plate 206 for fastening the plates 204, 206 to the body 202. While FIG. 7 is illustrated as an exploded view, when combined, the ceiling fan drive assembly will look similar to that of FIG. 2.

In operation, the base plate 206 can slide out of the body 202 along arrows 226 with the partition 208 and trim element 218 sliding along the slots 220. Prior to sliding the base plate 206 and the partition 208, fasteners, such as screws, can be removed from the openings 224 in the base plate 206. The trim element 218 at the sidewalls 212 of the partition 208 provides for guiding and sliding the base plate 206, the partition 208, and the power control module 216 out of the bottom of the body 202 for ease of servicing. Similarly, upon finishing any servicing or maintenance, the power control module 216 can mount to the partition 208 and slide back into the body 202 along the arrows 226. The base plate 206, carrying the partition 208 and the power control module 216 can mount to the body 202 at the openings 224 with one or more fasteners, such as screws for example.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electronics assembly comprising:
    a housing at least partially defining an interior and including at least one open end;
    a cover mounted to the housing at the at least one open end, removably enclosing the interior at the at least one open end;
    a slot provided along the interior;
    a partition, slidable along the slot to effectively separate the interior into a first section and a second section, the partition including an opening and mounted to the cover, with the opening configured to carry an electrical component on the partition; and
    wherein the partition is mountable within the interior by securing the cover to the at least one open end.

2. The electronics assembly of claim 1 wherein the partition further includes a set of fastener openings adjacent the opening configured to mount to the electrical component within the opening.

3. The electronics assembly of claim 1 wherein the first section is a vent section and the second section is an electronics section.

4. The electronics assembly of claim 3 wherein the electronics section is larger than the vent section.

5. The electronics assembly of claim 1 further comprising a second cover plate enclosing a second open end of the at least one open end.

6. The electronics assembly of claim 5 wherein the cover is integral with the partition.

7. The electronics assembly of claim 6 wherein the cover and the second cover plate both include a vent located adjacent to the first section.

8. The electronics assembly of claim 7 further comprising a fan mounted within the first section.

9. The electronics assembly of claim 1 wherein the cover further includes one or more electronics receptacles.

10. The electronics assembly of claim 1 wherein the electrical component includes a component for a ceiling fan assembly.

11. An electronics assembly comprising:
    a housing, defining an interior, and including an open end and a pair of opposing slots;
    a first cover mounted to the housing at the open end and enclosing the interior at the open end;
    a partition, including an opening, mounted to the first cover, and slidably positioned within the interior along the pair of opposing slots when the first cover mounts to the housing, with the partition separating the interior into a first section and a second section; and
    wherein the opening in the partition is configured to receive an electronics component to fully separate the first section and the second section.

12. The electronics assembly of claim 11 further comprising a second cover plate enclosing a second open end of the housing.

13. The electronics assembly of claim 11 wherein the first cover is integral with the partition.

14. The electronics assembly of claim 11 wherein the first cover includes a vent adjacent to the first section.

15. The electronics assembly of claim 14 further comprising a fan mounted within the first section.

16. The electronics assembly of claim 11 wherein the first section is a vent section and the second section is an electronics section.

17. The electronics assembly of claim 16 wherein the electronics section is larger than the vent section.

18. An electronics assembly defining an interior, the electronics assembly comprising:
    a housing encasing the interior and including an open end;
    a pair of opposing slots provided along the housing within the interior;
    a cover mounted to the housing and enclosing the interior at the open end, with the cover including a set of vent openings and a set of electronics receptacles; and
    a partition mounted to the cover and including an opening, with the partition slidably mounted in the interior along the pair of opposing slots when the cover mounts to the housing to enclose the interior at the open end, and with the partition effectively separating the interior into a first section and a second section.

19. The electronics assembly of claim 18 wherein the opening in the partition is configured to carry an electrical component.

20. The electronics assembly of claim 18 wherein attachment of one or more electrical components to the partition at the opening fully separates the interior into the first section and the second section.

* * * * *